United States Patent
McEwen-King et al.

(10) Patent No.: US 9,459,329 B2
(45) Date of Patent: Oct. 4, 2016

(54) MAGNETIC FIELD DETECTOR

(75) Inventors: Magnus McEwen-King, Farnborough (GB); David John Hill, Dorchester (GB); Alastair Godfrey, Farnborough (GB)

(73) Assignee: Optasense Holdings Limited (GB)

( * ) Notice: Subject to any disclaimer, the term of this patent is extended or adjusted under 35 U.S.C. 154(b) by 234 days.

(21) Appl. No.: 13/819,253

(22) PCT Filed: Aug. 31, 2011

(86) PCT No.: PCT/GB2011/001282
§ 371 (c)(1),
(2), (4) Date: Feb. 26, 2013

(87) PCT Pub. No.: WO2012/028846
PCT Pub. Date: Mar. 8, 2012

(65) Prior Publication Data
US 2013/0154632 A1 Jun. 20, 2013

(30) Foreign Application Priority Data

Sep. 1, 2010 (GB) .................................. 1014506.8

(51) Int. Cl.
*G01R 33/032* (2006.01)
*G02B 6/44* (2006.01)

(52) U.S. Cl.
CPC ......... *G01R 33/0327* (2013.01); *G02B 6/4401* (2013.01)

(58) Field of Classification Search
CPC ............ G01R 33/543; G01R 33/4818; G01R 33/4828; G01R 33/546; G01R 33/385; G01R 33/5608

USPC ........................... 324/67, 326, 426, 132, 309
See application file for complete search history.

(56) References Cited

U.S. PATENT DOCUMENTS

| | | | | |
|---|---|---|---|---|
| 4,371,838 A | * | 2/1983 | Griscom | 324/244.1 |
| 4,376,248 A | * | 3/1983 | Giallorenzi et al. | 250/227.19 |
| 4,650,281 A | * | 3/1987 | Jaeger et al. | 385/127 |
| 4,937,833 A | * | 6/1990 | Kabacoff | H01S 3/1066 359/280 |
| 7,154,081 B1 | * | 12/2006 | Friedersdorf et al. | 250/227.14 |
| 7,711,264 B1 | * | 5/2010 | Eslambolchi et al. | 398/9 |
| 2005/0159741 A1 | * | 7/2005 | Paul et al. | 606/41 |
| 2010/0316328 A1 | * | 12/2010 | Arias Vidal et al. | 385/12 |

FOREIGN PATENT DOCUMENTS

| | | | | |
|---|---|---|---|---|
| GB | 2171509 | | 8/1986 | |
| GB | 2171509 A | * | 8/1986 | G01R 33/032 |
| GB | 2442745 | | 4/2008 | |

* cited by examiner

*Primary Examiner* — Arleen M Vazquez
*Assistant Examiner* — Alesa Allgood
(74) *Attorney, Agent, or Firm* — McDonnell Boehnen Hulbert & Berghoff LLP (57) ABSTRACT

There is provided a system (100) for magnetic field detection, comprising a fiber optic interrogator (104) adapted to interrogate a first length of optical fiber (102) with interrogating radiation, detect radiation backscattered from said optical fiber and analyze said detected radiation to provide distributed sensing indicative of mechanical disturbances of said optical, wherein the optic fiber is mechanically coupled to a material whose dimensions vary dependent on applied magnetic field. Changes in dimensions of the optic fiber as can be detected by virtue of changes in back-scattering of light from said fiber using the principles of fiber optic distributed acoustic sensing.

29 Claims, 7 Drawing Sheets

MAGNETIC FIELD DETECTOR

FIELD OF THE INVENTION

The present invention relates to magnetic detection, in particular, it relates to magnetic field detection using magnetically sensitised optical fibres for fibre optic distributed sensing (DS).

BACKGROUND OF THE INVENTION

Magnetic sensing is used in a variety of applications. In particular, in geological surveys there is a need to measure magnetic fields over distance, in order to help prospectors searching for minerals, or in particular, oil and gas deposits.

Currently, individual magnetic detectors are lowered into bore holes to give data at different depths. These detectors are very expensive, and each one needs separate connection to the surface where data capture and monitoring equipment is based. Also, the environment in these bore holes, or "down-holes" is very demanding and may not be suitable for any fine instrument.

Typically such detectors operate by inserting a fixed magnet into another down-hole at some distance from the down-hole containing the detectors. By detecting the magnetic field from the magnet at the detectors, information on the geology in the rocks, the susceptibility and magnetic nature of the minerals between the two down-holes can be detected.

As these holes can be many miles deep, in order to yield a finely structured tomography, it is necessary to have many detectors at short intervals down the holes. However due to the high price of detectors and difficult down-hole conditions, it is common for a very small number of detectors to be used, or for just one detector to be lowered the whole distance.

If is therefore desirable to provide a magnetic field detector that is capable of detecting a magnetic fields over a long distance.

It is further desirable to provide a linear detector which gives continuous data along its whole length, thereby speeding up the survey and giving more reliable data that is not subject to time based variations in temperature and pressure, for instance to create a 3D map or tomography of the geological strata being investigated.

The ability to measure magnetic fields over long distances or in environments where precision instruments may not easily be used would also be desirable for instance in threat detection in maritime applications.

SUMMARY OF THE INVENTION

According to an aspect of the present invention, there may be an apparatus for magnetic field detection, comprising: a fibre optic interrogator configured to interrogate a first length of optical fibre with interrogating radiation, detect radiation backscattered from said optical fibre and analyse said detected radiation to provide distributed sensing indicative of mechanical disturbances of said optical fibre; wherein the said first length of optical fibre is mechanically coupled to a magnetically responsive material whose dimensions vary dependent on the applied magnetic field.

In another aspect of the present invention a method of detecting magnetic fields, comprising: interrogating a first length of optical fibre with interrogating electromagnetic radiation; detecting radiation backscattered from said optical fibre; and analysing said detected radiation to provide distributed sensing indicative of mechanical disturbances of said optical fibre; wherein the optic fibre is mechanically coupled to a material whose dimensions vary dependent on the applied magnetic field.

The method and apparatus according to these aspects of the present invention effectively apply distributed acoustic sensing techniques to an optical fibre that is configured so as to be magnetically sensitised. Thus a magnetic field applied to such a fibre will lead to a mechanical disturbance being experienced by the optical fibre.

As will be described in more detail below distributed acoustic sensing is a known technique wherein one or more interrogation pulses are used to interrogate an optical fibre and the radiation backscattered from the fibre is detected. Mechanical disturbances of the fibre result in changes in the amount of backscattered radiation from the relevant section of fibre. These changes in backscatter can be used to give an indication of the intensity of the disturbance and using optical time domain reflectometry type techniques the position in the fibre can also be determined. In a distributed acoustic sensor the disturbances are due to incident pressure waves or other strains on the fibre. The present invention relies partly in the realisation that coupling a fibre to a material whose dimensions vary dependant on the applied magnetic field can result in disturbances (in use in a magnetic field) of sufficient magnitude that can be detected reliably using the principles of distributed acoustic sensing. The terms distributed acoustic sensor shall therefore be used to refer to a sensor that detects local disturbances of the fibre by analysing the backscattered radiation and shall be taken to include distributed optical fibre vibration sensors or distributed optical fibre strain sensors. It will be appreciated that in embodiments of the present invention the distributed fibre optic sensor may not be implemented to sense any incident acoustic signals.

In general then, in a magnetic field, a strain (or in fact $1^{st}$ and $2^{nd}$ time differentials of local strain) is created in an optic fibre by coupling it mechanically to a material that is affected by a magnetic field, particularly a material whose dimensions are changed in a field. Ideally this should be one whose dimensions change anisotropically, so that flux in one dimension only may selectively be detected. The magnetically responsive material may comprises a magnetostrictive material.

The mechanical contact may be achieved by coating said fibre with the magnetically responsive material.

The magnetically responsive material may comprise particles in the form of powder or anisotropic particles in a binder material.

The majority of the particulate may be in the size range 100 to 0.3 micrometer mean diameter.

The coating material may include a polymer or adhesive.

The magnetically responsive material may comprise a metal, such as nickel.

The magnetically responsive material may comprise at least one wire of magnetostrictive material disposed along the first length of optical fibre. The wire may be arranged with the optical fibre within a jacket material. A plurality of wires may be arranged longitudinally along the optic fibre. A wire may be coextruded in a polymer coating of the optic fibre. A plurality of wires may be equally spaced circumferentially around the optic fibre. At least one wire may be wound round the optical fibre.

The magnetically responsive material may comprise a material braided around and coupled to the optic fibre.

The sensor apparatus may further comprise a second length of optical fibre deployed alongside the first length of optical fibre. The interrogator may be configured to interrogate both said first and second lengths of optical fibre to provide distributed sensing. The second length of optical fibre is configured to be substantially insensitive to any changes in applied magnetic field, i.e. it is substantially uncoupled from the magnetically responsive material.

As will be explained in more detail later the first length of optical fibre will be sensitive to mechanical disturbances generated by the magnetically responsive material. However it may also be sensitive to other mechanical disturbances such as from incident acoustic signals. By providing a second length of optical fibre, that shows substantially no response to changes in magnetic field, which is deployed along substantially the same path as the first length of optical fibre, the effect of any mechanical disturbances which are not magnetically induced can be detected and compensated for.

Whilst the first and second lengths of optical fibre may be different optical fibres in one embodiments they are different parts of the same optical fibre. Thus one part of the optical fibre may be mechanically coupled to magnetically responsive material whilst another part arranged to be substantially insensitive to applied magnetic field. The optical fibre can then be looped back on itself so that the first and second lengths are adjacent one another.

Note, in some embodiments, to ease compensation for acoustic signals and the like the first and second lengths of optical fibre may desirably have properties that are as similar as possible, with the exception of magnetic sensitivity. Thus the size and weight of the first and second lengths of optical fibres may be substantially the same as one another.

The apparatus may therefore comprise a processor configured to use the signals from interrogating the second length of optical fibre to compensate for any non-magnetically induced disturbances affecting the signals from interrogating the first length of optical fibre.

The first and second lengths of optical fibre may be disposed within a single fibre optic cable.

In another embodiment the apparatus may further comprise at least one magnetic field producing element configured to provide, in use, a biasing magnetic field to the first length of optic fibre. As will be described in more detail later by biasing the optical fibre with a magnetic field the sensitivity of the magnetic field detector may be improved.

The at least one magnetic field producing element may comprise at least one magnetic element disposed along the first length of optical fibre.

The at least one magnetic element may comprise at least one wire arranged along the first length of optical fibre.

The at least one magnetic element may comprise magnetic material braided around and coupled to the optic fibre.

The at least magnetic element may comprise particles of magnetic material disposed in a coating of the optical fibre.

The magnetically responsive material may comprise a first coating material and the at least one magnetic element may comprise a second coating material with the first length of optical fibre being provided with a coating comprising alternating sections of first and second coating material.

The at least one magnetic field producing element may comprise an electrically conductive element, through which a current may be applied. In one embodiment the optical fibre comprises: an optical fibre core (i.e. an optical core and any cladding needed to provided light guiding), a first coating; and a first conductive layer arranged around the first coating. The first conductive layer provides the electrically conductive element and the first coating may comprise the magnetically responsive material. The optic fibre may further comprise: a second coating material around the first conductive layer; and a second conductive layer around the second coating.

The first and second conductive layers may be electronically coupled at the distal end of the optical fibre with respect to the interrogator unit to provide a round trip path.

The apparatus may therefore comprise an electric source, i.e. a voltage source or the like, connected to the electrically conductive element so as to generate, in use, a current in said electrically conductive element. A controller may be configured to control the electric source so as vary the applied current at a predetermined frequency such that the biasing magnetic field varies at that predetermined frequency. The controller may be arranged to dither the predetermined frequency, i.e. change the predetermined frequency during use.

In another aspect of the present invention, there is provided a method of manufacturing an optical fibre, comprising the steps of: preparing a suspension of magnetostrictive powder in a curable liquid; drawing the fibre through the liquid suspension; and curing the liquid suspension.

The curable liquid may be UV cureable.

In a further aspect of the invention there is provided a fibre optic cable for use in fibre optic distributed magnetic sensing comprising a first optical fibre and a magnetostrictive material mechanically coupled to said first optical fibre.

The magnetostrictive material may be disposed as a coating material for said first optical fibre and/or braided around said first optical fibre.

The fibre optic cable may comprise a second optical fibre which configured so as to be substantially unaffected by any magnetically induced changes in said magnetostrictive material.

The invention may comprise any combination of the features and/or limitations referred to herein, except combinations of such features as are mutually exclusive.

DESCRIPTION OF THE DRAWINGS

Embodiments of the present invention will now be described, by way of example, with reference to the accompanying drawings, in which.

DESCRIPTION OF THE INVENTION

Figure 1:
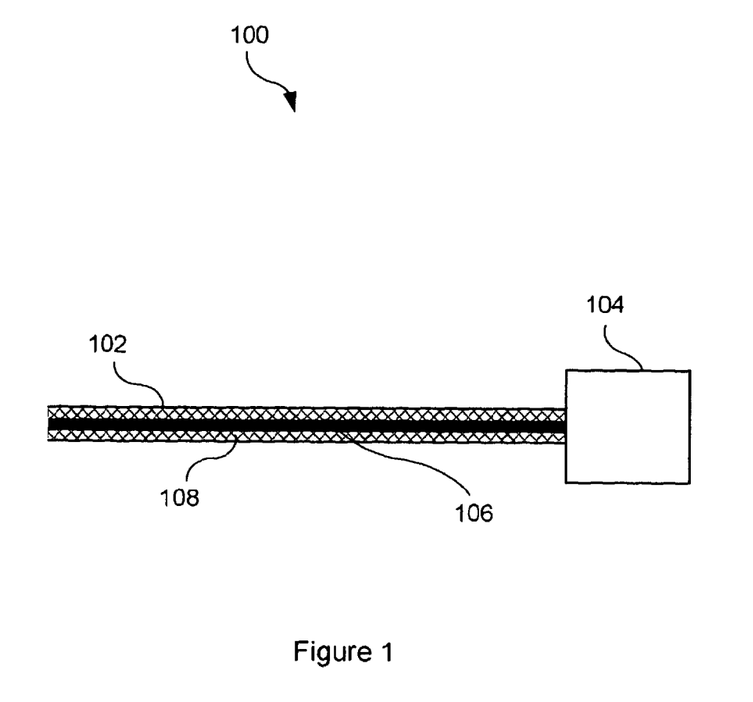
FIG. 1 schematically shows an apparatus for detecting magnetic fields using distributed sensing.

A distributed sensing system 100 is shown in FIG. 1. A fibre optic cable 102 is connected to an interrogator/processor unit 104. Interrogator 104 injects light into the optic fibre 102 and senses the light backscattered from along the length of the fibre optic 102. The particular form of the input light and the sampling/processing capability of the interrogator 104 enables simultaneous output of multiple data channels, each channel corresponding to measurement data of disturbances sensed along a particular section of the optic fibre 102 and at a particular distance along the optic fibre 102. A suitable distributed sensing interrogator is described in GB2442745 for example, the content of which is hereby incorporated by reference. GB2442745 describes a distributed acoustic sensor wherein each sensing portion of the fibre acts as an acoustic sensor for any disturbances due to incident acoustic waves, i.e. pressure waves. In general however the system is responsive to any suitably intense mechanical disturbance or strain. In embodiments of the present invention the same general interrogation technique is used to provide distributed magnetic sensing.

While the interrogator 104 is shown in FIG. 1 as a single unit, the hardware may be divided into multiple units. For example, it may be divided into an interrogator box providing raw output data that may then be provided to a separate processor to provide the processing capability. The processor may include a sampler that is arranged to sample a plurality of channels output from said interrogator simultaneously to provide measurement data from a plurality of contiguous portions of said fibre at each of a plurality of times. The processor may also include a data analyser adapted to process the sampled data to detect magnetic field changing events and output parameters associated with the detected events.

As can be seen in FIG. 1, fibre optic cable 102 comprises a core 106 and a coating 108. As used herein the term core will be taken to mean the optical waveguide and may include any optical cladding material that forms part of the waveguide. the coating 108 is a jacket layer that serves to protect and strengthen the optic fibre core. According to an embodiment of the present invention, optic fibre 102 is provided with a coating 108 that contains magnetostrictive material. The optic fibre core 106 is therefore mechanically coupled to the magnetostrictive material. As the skilled person will appreciate, the physical properties of a magnetostrictive material vary dependent upon the applied magnetic field. Presence of a magnetic field at a particular point along optic fibre 102, which may be tens of kilometers long, causes changes in the dimensions of the coating 108 in that region, for instance a change in length. as the coating is coupled to the optic fibre such a change in dimension of the coating in turn causes localised changes in the optical path length of the optic fibre 102, i.e. a corresponding change in length and/or bend in the optical fibre which can be detected due to changes in the backscatter during distributed sensing.

Therefore, by providing optic fibre 102 with magnetostrictive coating 108, magnetic fields can be detected continuously along the length of the optic fibre 102. The system 100 of FIG. 1 is able to detect localised magnetic fields along its whole length, which may be tens of kilometers. Also, as the system is able to split the optic fibre into a number of discrete longitudinal sensing sections, the location of an incident magnetic field can be detected. Further, as the system uses an optic fibre as the sensor, which is a simple sensor which can be relatively robust/resilient, it does not suffer the same drawbacks of prior art systems in measuring magnetic fields in difficult conditions, such as down hole. The fibre can be deployed relatively easily and used in environments where conventional magnetic sensing instrument may not readily be used or would be otherwise too expensive.

A key material component required to make the optical fibre sensitive to magnetic field is a material with magnetostrictive properties. Examples of such a material would be iron, nickel, cobalt (the magnetostrictive elements) or more sensitive alloys designed for their magnetostrictive properties such as Terfenol-D. A method of putting this fibre sensitiser as a coating onto an optical fibre is described below.

Magnetostrictive materials change dimension in the presence of a magnetic field. If Magnetostrictive materials are mechanically coupled to an optic fibre, this strain can be transferred to the fibre, and subsequently detected. Experiments have shown that the magnetostrictive material can be applied as a coating to the fibre in the form of a powder set in a flexible binder matrix. This has significant benefits for manufacture.

In an embodiment of the present invention, the powder may be coated onto the fibre by mixing with an air curing binder then the fibre may be drawn through the mixture, and on through a defined aperture. This coating method can be applied to large scale manufacturing techniques.

An existing method for coating optical fibres with an acrylate protective film is to draw the fibre though the binder which is in liquid form, then cure the liquid with suitable curing radiation, such as UV. Several layers of coating with different properties are usually applied.

This powder coating method can be adapted in embodiments of the present invention, in which a suspension of magnetostrictive powder is made in the, e.g. UV, curable liquid before coating onto the optic fibre using the usual procedure. It is clear that many variables such as coating thickness, curing time, powder loading etc will need to be optimised for magnetic properties as well as production rates, depending on the type of magnetostrictive powder used. Pre-existing coating equipment can be usable for this coating technique, resulting in low production costs.

Some types of magnetostrictive powder have asymmetrical magnetostrictive properties. Alignment of the powder can be carried out in a magnetic field prior/during the curing of the binder to fix the powder orientation in the most appropriate direction for maximum sensitivity.

Once coated with magnetostrictive material, an additional protective layer may or may not be needed, but essentially all the usual fibre processing methods should still be applicable.

Figure 2:
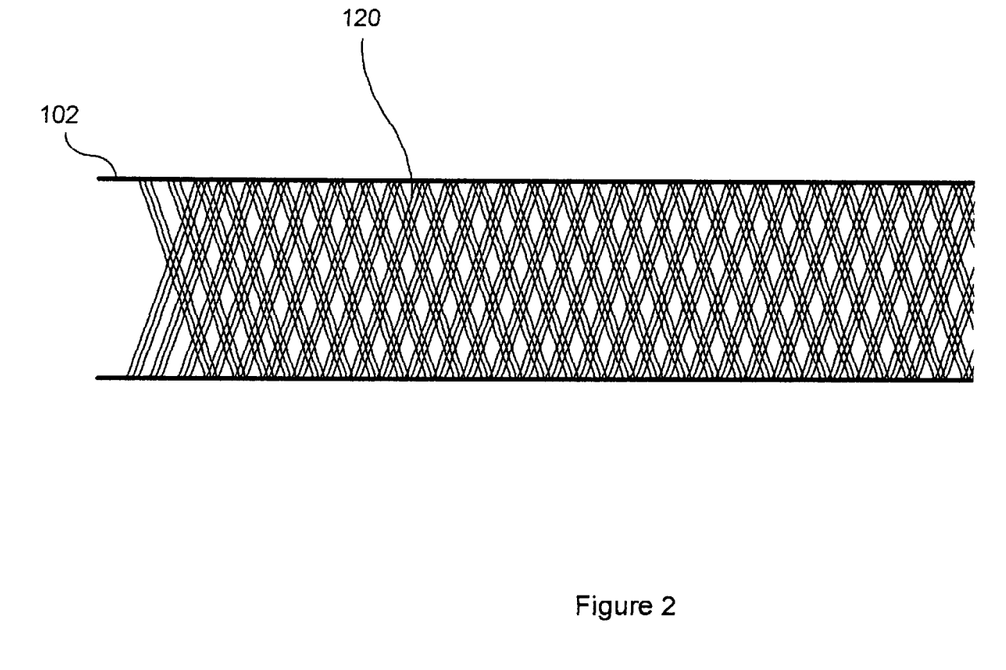
FIG. 2 schematically shows an optic fibre coupled to braided wires.

Another way of providing magnetostrictive material that is coupled to the optic fibre is shown in FIG. 2.

FIG. 2 shows an optic fibre 102, which is coated in a conventional manner with a first jacket material (not shown), that may typically be a polymer such as nylon. Conductive wire 120, which may be nickel, is wound around the optic fibre and may be braided on top of the polymer coating. In production, the nickel wires 120 may be extruded over the polymer coating around the optic fibre and may be squeezed on to the optic fibre by the use of external gas pressure. This pressure may be applied while the polymer coating is soft, thereby allowing the braiding to grip to the optic fibre. An additional polymer coating (not shown) may then be provided over the braided nickel wires 120.

This arrangement provides the advantage of coupling the magnetostrictive material (nickel wires) to the optic fibre without causing losses in the optic fibre due to microbending.

In another embodiment, an alternate way of providing magnetostrictive material that is coupled to the optic fibre is provided. In this embodiment, conductive wire (nickel wire) may be coextruded within a jacket layer, which may be a polymer, such as nylon, parallel to the optic fibre and along the length of the optic fibre. A plurality of wires may be provided which may be spaced around the fibre, for example equally spaced around the optic fibre core, and are embedded in the layer of polymer. As will be understood, one or more wires may be provided that may or may not be equally spaced around the optic fibre. In one specific embodiment four nickel wires are spaced equally around the optic fibre.

This production method will produce faster production rates than for the braided method of FIG. 2, but there will be a smaller proportion of wire coupled to the fibre for transferring strain.

The cross section of the conductive wire may be chosen depending on what strain characteristics are desired in the wire.

When in use, the apparatus of FIG. 1 will able to detect magnetic fields along the length of the fibre, as described above. However, other external factors such as pressure waves, acoustic waves and temperature variation may cause additional signals and it typically will be desirable to discriminate the signals due to magnetic fields from other signals.

Figure 3:
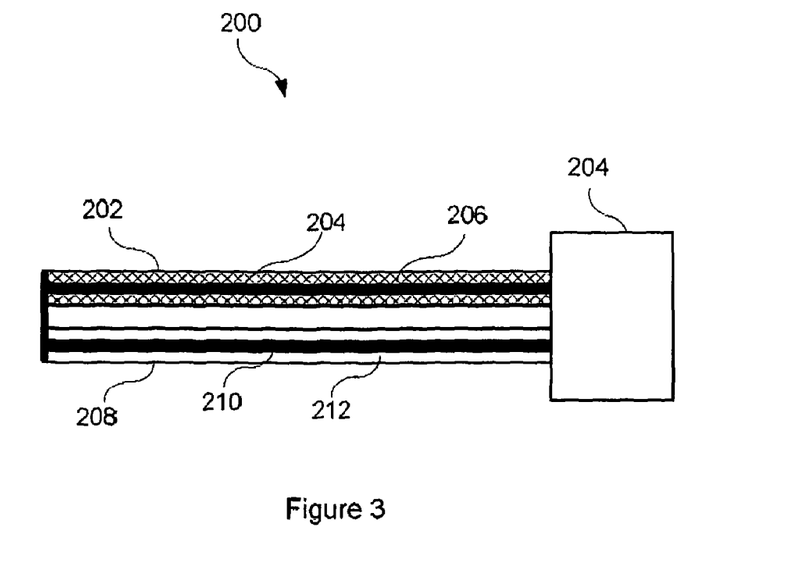
FIG. 3 schematically shows an apparatus for detecting magnetic fields using distributed sensing in which unwanted signals can be cancelled.

FIG. 3 shows an apparatus 200 for detecting magnetic fields using distributed sensing in which unwanted signals can be cancelled/compensated for.

To cancel signals not related to changing magnetic fields, according an embodiment of the present invention, it is proposed that a control optic fibre 208 is made with an identical coating 212 (i.e. binder material) and with similar metal loading within the coating, but that the metal used is non-magnetostrictive (for example copper which has a similar density and is inexpensive and readily available). This fibre should then be run close to the magnetically sensitised cable 202 so that the signals detected form it can be subtracted from the signals detected from the fibre optic 204 loaded with the magnetostrictive material 206. By using the same coating binder and using metal loading with similar properties, but without magnetostrictive functionality, the response of the control optic fibre 210 to acoustic signals and the like should be effectively the same as the magnetically sensitised optic fibre 202. However this may not be necessary in some embodiments and any control fibre may be used.

The signal subtraction could be done in various ways. The interrogator could comprise two separate interrogation units, one for each optical fibre. Alternatively, a interrogator unit 204 could be used and multiplexed between two optical fibre in a time multiplexed manner for example, i.e. arranged to send interrogating radiation alternately down the sensitised fibre then down the non-sensitised fibre. In another arrangement, a single interrogator could be used with the sensitised fibre coupled in series with the non-sensitised fibre and with the fibre doubled back on itself.

In this third method, the doubling back of the fibre may mean some loss at the connection (if separate fibres are used and spliced together), and the range will be halved. However, down-hole applications are not expected to be range or frequency limited. Instead of two different fibres being coupled at the end a single fibre could be manufactured with different coatings applied on at different points on the same fibre, so as to provide a first length of fibre which is magnetically sensitised and a second length of the same fibre which is not.

Figure 4:
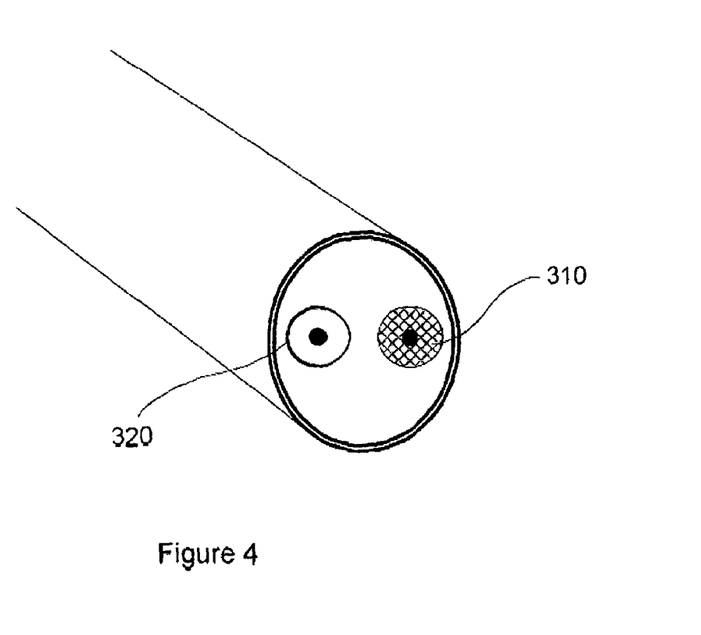
FIG. 4 shows a cross section of a gel filled outer casing containing an optic fibre coated in magnetostrictive material and a control fibre that is not.

The two sections of fibre need to be of consistent and with small separation. This could be achieved by installing the fibres in a standard gel filled outer casing. FIG. 4 shows such an arrangement, in which a gel filled casing contains an optic fibre coated in magnetostrictive material 310 and a control fibre 320 that is not.

However, in the case that too much crosstalk occurs between the fibres, a larger separation may be required. This could be done externally with fittings, or internally by using a specially manufactured casing which isolate the fibres from each other acoustically.

In addition the fibres could be arranged in casings and/or further coatings that do not interfere with any magnetic filed presence but which lessen the effect of any incident acoustic waves or temperature changes.

A processor may therefore receive signals indicative of mechanical disturbances on the control optical fibre and also signals indicative of mechanical disturbances on the magnetically sensitised fibre. In a simple arrangement the processor may be arranged to simply subtract the control signals from the signals from the magnetically sensitised fibre to leave the signals of interest, although more complex signal processing may be performed if required.

Although FIGS. 3 and 4 shown arrangements in which unwanted signals caused by acoustic stimuli, thermal variations and the like can be identified, and thus cancelled, in some applications, the signals of interest may be discriminated from unwanted signals without the need for a control optic fibre.

Figure 5:
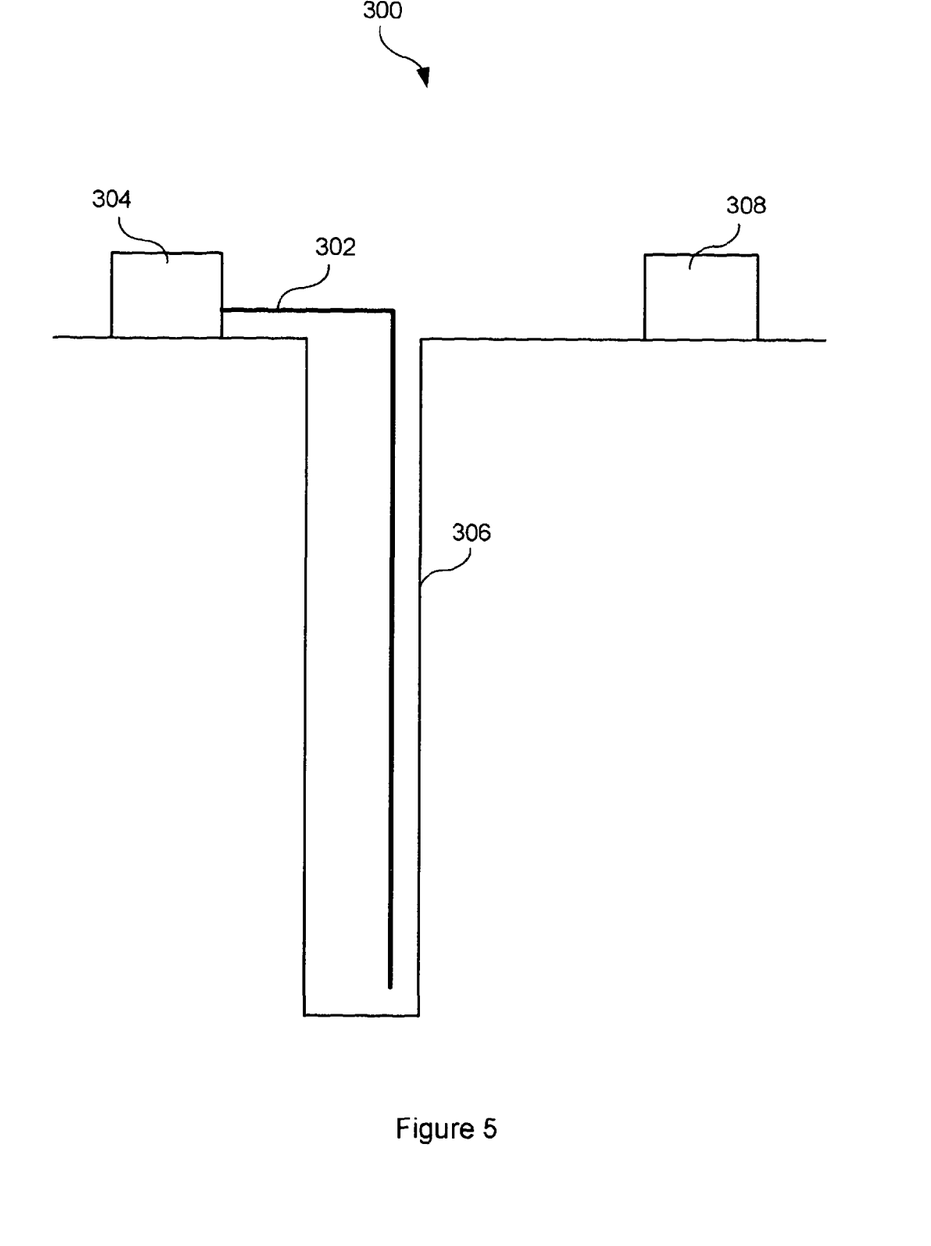
FIG. 5 schematically shows an apparatus for down well geomagnetic profiling.

FIG. 5 shows an arrangement 300, which in this example is being used for geomagnetic surveying. FIG. 5 shows an optic fibre 302 connected to an interrogator unit 304, as described above. The optic fibre 302 is the optic fibre as shown in FIG. 1 in which magnetostrictive material is provided in the costing of the fibre such that the core of the optic fibre is mechanically coupled to the magnetostrictive material. Optic fibre 302 is arranged down a well bore 306. It will be appreciated that optic fibre 302 may be coupled to production or other suitable casings (not shown) within the well bore. Also, in different applications, the optic fibre 302 may be located buried along the surface of the ground or embedded within a structure.

A magnetic field generator 308 is provided at a position distant from the optic fibre and is arranged to generate a magnetic field that varies with a predefined frequency.

As the optic fibre 302 is mechanically coupled to magnetostrictive material, the presence of a magnetic field from the generator 308 can be detected due to the strains caused in the optic fibre, as described above. As will be apparent, the magnetic field must penetrate through the ground to reach the optic fibre, and so an disturbance in the magnetic field caused by the ground composition can be detected.

The signals detected in the optic fibre due to the strains induced by the magnetic fields will be dependent on the known frequency of the magnetic field. There may be other signals detected from the optic fibre that are dependent on acoustic noise or temperature fluctuations, but these will not be dependent on the same frequency as that of the magnetic field.

Therefore, by using known filtering techniques in the post processing of the signals from the optic fibre 302, signals that have a frequency different to the generated magnetic field can be cancelled. Averaged over time, the signals due to acoustic and other noise signals should become insignificant. This technique is applicable to any arrangement where it is known that a magnetic signal of interest will have a known frequency or frequency pattern.

As described above, when an optic fibre of the construction described above in relation to FIG. 1 is subject to a magnetic field, the effect of the magnetic field on the magnetostrictive material causes a strain in the optic fibre, this strain causes a change in length of the optic fibre. It has been found that the change in length is non-linear with respect to the strength of the applied magnetic field.

Figure 6:
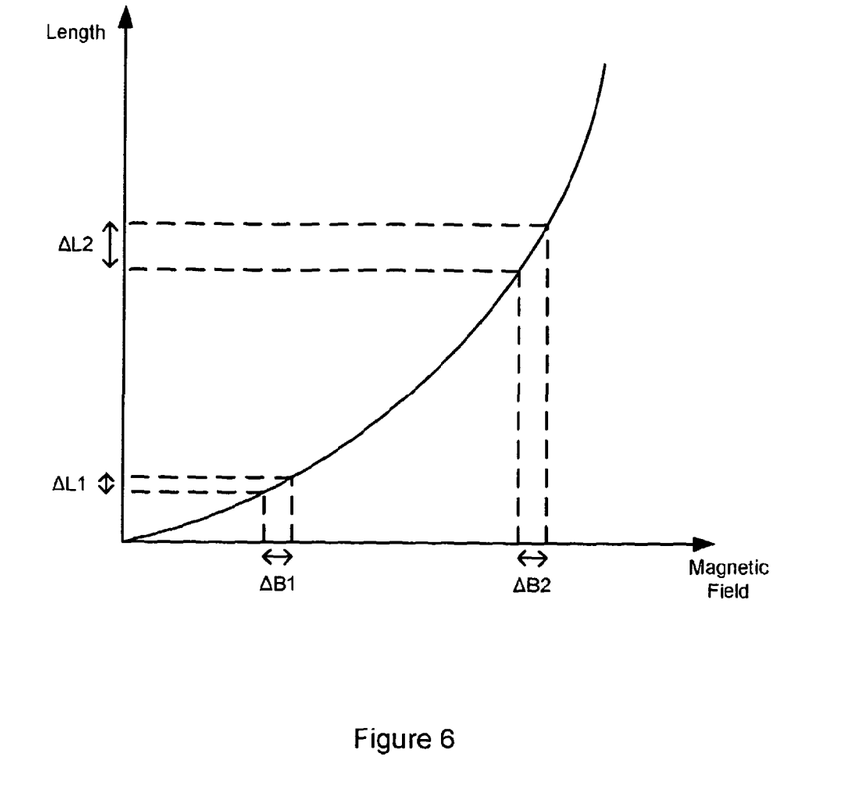
FIG. 6 shows a graph of the length change against applied field strength.

FIG. 6 shows a graph illustrating the non-linear change in length of an optic fibre with increasing applied magnetic field.

As shown in FIG. 6, a first change in magnetic field ΔB1, causes a first change in length of the fibre ΔL1. A second change in magnetic field ΔB2, causes a second change in length of the fibre ΔL2. The change in magnetic field ΔB1 and ΔB2 are equal in magnitude, but the change in magnetic field ΔB2 occurs at higher field strength than that of ΔB1. As can be seen, the change in magnetic field ΔB2 causes a larger change ΔL2 in length of the fibre than the change ΔL1 caused by the change in magnetic field ΔB1.

As the magnitude of the strain induced in the optic fibre is dependent on the strength of the applied magnetic field, the signal to noise ratio of the magnetic field detector of FIG. 1 can be improved by applying a biasing magnetic field. In other words, by applying a biasing magnetic field to the optic fibre, any additional magnetic fields above the biasing magnetic field will be detected, but the additional magnetic fields will cause a greater strain in the fibre than they would without the presence of the biasing magnetic field and hence will produce a larger strain in the optic fibre. This is because the overall magnetic field is higher due to the presence of the biasing magnetic field.

A biasing magnetic field may be applied in what will be referred to as a passive method, in which one or more materials which are inherently magnetic, e.g. are permanent magnets, are arranged to increase the magnetic field strength. Alternatively in what will be referred to as an active method an electromagnetic magnetic field could be generated by electrical means.

Figure 7:
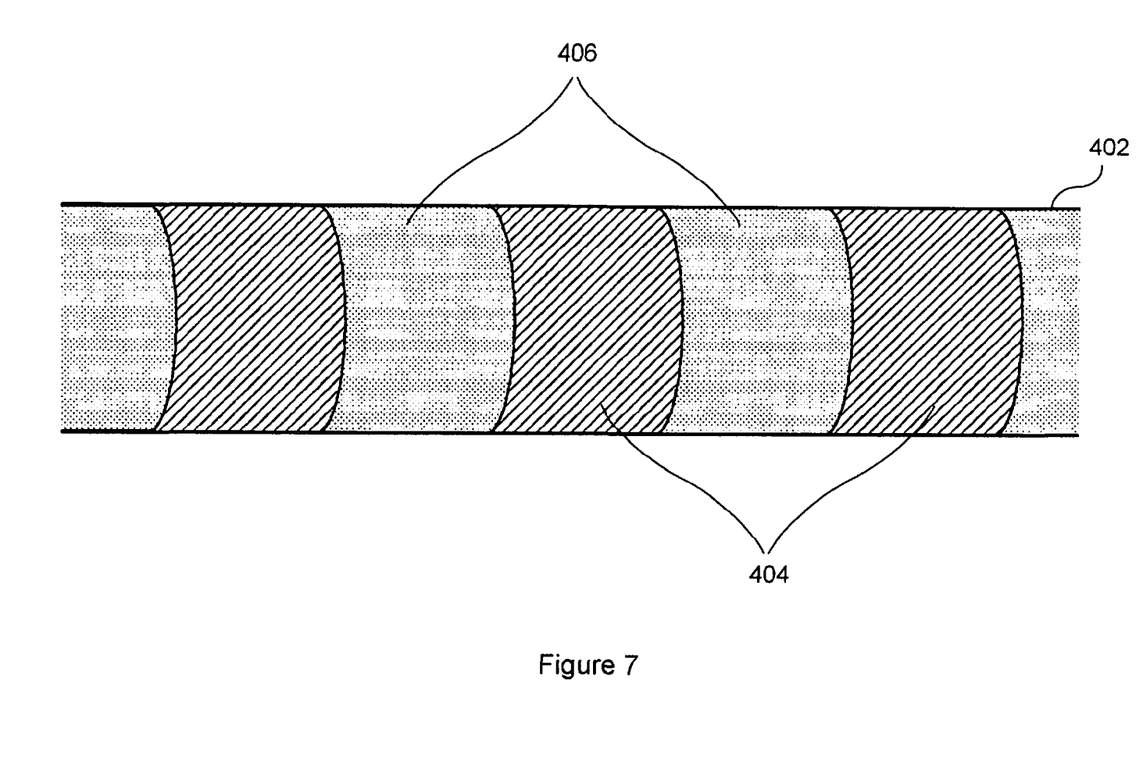
FIG. 7 shows an optic fibre arranged to provide a passive biasing magnetic field.

An example of an optic fibre arranged such that a bias is applied passively is shown in FIG. 7.

In FIG. 7, an optic fibre 402 is provided. The optic fibre 402 comprises an optic fibre core (not shown) in which light can propagate, i.e. core and cladding material that together provide light guiding properties, as in a conventional optic fibre. As can be seen in FIG. 6, the coating of optic fibre 402 is split into a plurality of discrete bands/sections. A first plurality of discrete sections 404 contains magnetostrictive material. The optic fibre core is therefore mechanically coupled to the magnetostrictive material in these sections of the fibre and presence of a magnetic field will cause a change in the dimensions of the fibre in those regions, which can be detected, as described above.

The coating of the optic fibre in the sections 404 can be manufactured according to any of the above described methods.

A second plurality of discrete sections 406, which contain magnetic field generating material, are provided alternately between the first plurality of sections 404. The purpose of the field generating material in these sections is to generate a magnetic field to bias the magnetostrictive materials such that any additional incident magnetic field will impart a larger strain on the fibre, as described above.

The second plurality of sections 406 may be manufactured in much the same way as for the sections including the magnetostrictive material, except that the magnetostrictive material is replaced with magnetic field generating material in the methods.

The sections 404, 406 may be applied to a polymer coating of the optic fibre.

As will be apparent to the skilled person, any magnetic field producing material may be used.

Although the discrete sections are shown as being approximately equal length, it will be apparent that the sections containing the magnetostrictive material may be wider than those containing the magnetic field generating material, and vice versa.

Also, although FIG. 7 shows the discrete sections being provided circumferentially, it should be apparent that the sections could be provided longitudinally along the length of the optic fibre, or may be spiralled around the optic fibre.

It will also be apparent that the sections 404, 406 may not be discrete sections and the magnetostrictive material may be interspersed continuously with the magnetic field producing material along the length of the optic fibre. Also there may be two coatings, an inner coating and an outer coating with one coating being magnetic and the other being magnetostrictive.

An alternative way of passively providing a bias magnetic field to the optic fibre may be to provide one or more strip/rod/wires of magnetic field producing material that is/are arranged to follow the path of an optic fibre whose coating is doped with magnetostrictive material. Each strip/rod/wire of magnetic field producing material should generally follow the path of the optic fibre, and can either by coupled to the optic fibre or positioned in the vicinity of the optic fibre. The strip/rod of magnetic field producing material may be an additional optic fibre with a coating doped with magnetic field producing material.

The above described passive methods for providing a bias magnetic field can be applied to a single fibre arrangement and the dual fibre (control fibre) arrangement of FIG. 2.

In order to apply a bias magnetic field to an optic fibre whose coating is doped with magnetostrictive material, in an active arrangement, a current can be applied to a conductor, such as a wire/cable that is arranged adjacent to the optic fibre. By applying a current to the wire, a magnetic field is produced, which will act to bias the optic fibre. The advantage of actively providing a bias magnetic field, rather than passively providing one, is that the bias field can be varied by varying the current through the cable.

For example, by applying a current with a predetermined frequency in the wire, i.e. an A.C. current, a magnetic field will be generated that varies at that frequency. The interrogator may be adapted to process the signal returns at the predetermined frequency.

In addition, a dither can be applied to signals detected from the optic fibre. In other words the frequency of the biasing magnetic field generated by the current can be changed over time. This aids in discrimination of the signals arising due to the magnetic field to be measured. The frequency of the biasing magnetic field in effect acts as a carrier frequency.

Using the frequency of the biasing magnetic field as a carrier frequency for signals representative of detected magnetic fields, unwanted signals caused by thermal fluctuations can be reduced. Reduction in the noise will improve the signal to noise ratio with respect to thermal fluctuations.

Furthermore, by using a high frequency carrier frequency, sensitivity of measurement of magnetic fields near DC will be improved. Often the magnetic fields to be measured produce a response which is near DC in the distributed fibre optic sensor. Such signals can be difficult to detect. By applying an active bias field and dithering the frequency of the bias field applied the fibre will produce a signal that depends on the magnitude of the DC field. Thus the DC signal can be detected.

Figure 8:
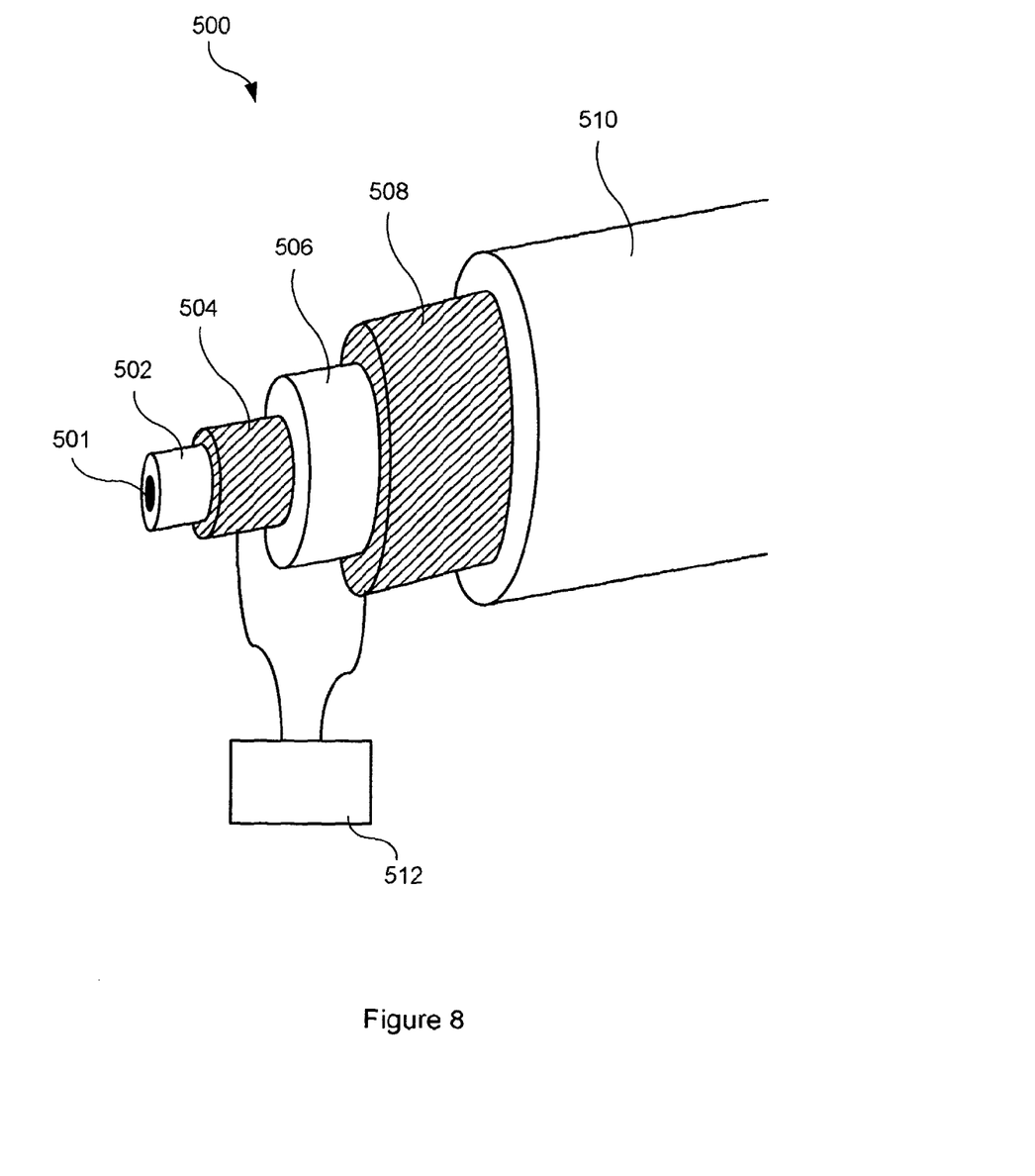
FIG. 8 shows an optic fibre arrangement to provide an active biasing magnetic field.

FIG. 8 shows one example of how a bias magnetic field could be actively applied. FIG. 8 shows an optic fibre 500, which comprises a plurality of concentric layers.

Optic fibre 500 comprises an optic fibre core 501 surrounded by a coating 502 that is doped with magnetostrictive material, as described above. Around the coating 502 is provided a first conductive layer 504, a polymer coating 506, a second conductive layer 508 and a polymer coating 510. The polymer layers 506, 510 act as insulators between the conductive layers 504, 508.

At the end of the optic fibre 500, the first and second conductive layers 504, 508 may be electrically coupled together (not shown), such that a current can be passed through the conductive layers 504, 508 to actively generate a bias magnetic field. The current is applied from a controller 512, which may be arranged to control the current to provide a frequency dependent magnetic field, as described above.

The arrangement of FIG. 8 provides the advantage that the polymer coating layers 506, 510 act to insulate the conductive layers 504, 508. This makes this arrangement safer to use in applications which may be sensitive to introducing a current, such as down well oil and gas applications.

Optical fibre having two concentric metallic layers are known, the metallic layers being provided for strength and durability. However in such known optical fibres there is no magnetostrictive material coupled to the optical fibre and the two metallic layers are not generally connected together.

Although the above generally describes the detection of magnetic fields with respect to monitoring in geological surveys, it should be apparent that the described systems and methods could equally be used in pipeline monitoring, border monitoring or hull monitoring on ships.

Whilst endeavouring in the foregoing specification to draw attention to draw attention to those features of the invention believed to be of particular importance, it should be understood that the applicant claims protection in respect of any patentable feature or combination of features hereinbefore referred to and/or shown in the drawings whether or not particular emphasis has been placed thereon.

The invention claimed is:

1. An apparatus for magnetic field detection, comprising:
   a first length of optical fibre;
   a second length of optical fibre deployed alongside the first length of optical fibre;
   a fibre optic interrogator configured to interrogate said first length of optical fibre with interrogating radiation, detect radiation backscattered from said first length of optical fibre and analyse said detected radiation to provide a first distributed sensing signal indicative of mechanical disturbances of said first length of optical fibre and to interrogate said second length of optical fibre with interrogating radiation, detect radiation backscattered from said second length of optical fibre and analyse said detected radiation to provide a second distributed sensing signal indicative of mechanical disturbances of said second length of optical fibre;
   wherein the said first length of optical fibre is mechanically coupled to a magnetically responsive material whose dimensions vary dependent on the applied magnetic field; and
wherein said second length of optical fibre is configured to be substantially insensitive to any changes in applied magnetic field.

2. The apparatus of claim 1, wherein the magnetically responsive material comprises particles disposed in a binder.

3. The apparatus of claim 1, wherein said magnetically responsive material comprises a magnetostrictive material.

4. The apparatus of claim 1, wherein said magnetically responsive material is disposed as a coating of said optical fibre.

5. The apparatus according to claim 1 wherein said magnetically responsive material comprises a material braided around and coupled to the optic fibre.

6. The apparatus as claimed in claim 1 wherein said first and second lengths of optical fibre comprise different parts of one optical fibre.

7. The apparatus as claimed in claim 1 further comprising a processor configured to use the signals from interrogating the second length of optical fibre to compensate for any non-magnetically induced disturbances affecting the signals from interrogating the first length of optical fibre.

8. The apparatus as claimed in claim 1 wherein said first and second lengths of optical fibre are disposed within a single fibre optic cable.

9. The apparatus of claim 1 wherein said magnetically responsive material comprises at least one wire of magnetostrictive material disposed along the first length of optical fibre.

10. The apparatus according to claim 9 wherein at least one of said wires is wound around said optical fibre.

11. The apparatus as claimed in claim 1 further comprising at least one magnetic field producing element configured to provide, in use, a biasing magnetic field to the first length of optic fibre.

12. The apparatus of claim 11, wherein said at least one magnetic field producing element comprises at least one magnetic element disposed along the first length of optical fibre.

13. The apparatus of claim 12 wherein said at least one magnetic element comprises at least one wire arranged along the first length of optical fibre.

14. The apparatus of claim 12 wherein said at least one magnetic element comprises magnetic material braided around and coupled to the optic fibre.

15. The apparatus of claim 12 wherein said at least one magnetic element comprises particles of magnetic material disposed in a coating of the optical fibre.

16. The apparatus of claim 15 wherein said magnetically responsive material comprises a first coating material and said at least one magnetic element comprises a second coating material and the first length of optical fibre is provided with a coating comprising alternating sections of first and second coating material.

17. The apparatus of claim 11 wherein the at least one magnetic field producing element comprises an electrically conductive element, through which a current may be applied.

18. The apparatus of claim 17, wherein the optical fibre comprises:
   an optical fibre core;
   a first coating; and
   a first conductive layer arranged around the first coating, wherein said first conductive layer comprises said electrically conductive element and said first coating comprises said magnetically responsive material.

19. The apparatus of claim 18, wherein the optic fibre further comprises:
   a second coating material around the first conductive layer; and
   a second conductive layer around the second coating.

20. The apparatus of claim 19, wherein the first and second conductive layers are electronically coupled at the distal end of the optical fibre with respect to the interrogator unit.

21. The apparatus of claim 17, further comprising an electric source connected to said electrically conductive element so as to generate, in use, a current in said electrically conductive element.

22. The apparatus of claim 21 further comprising a controller, configured to control the electric source so as vary the applied current at a predetermined frequency such that the biasing magnetic field varies at that predetermined frequency.

23. The apparatus of claim 22, wherein the controller is arranged to dither the predetermined frequency.

24. A method of detecting magnetic fields, comprising:
interrogating a first length of optical fibre with interrogating electromagnetic radiation;
detecting radiation backscattered from said optical fibre;
analysing said detected radiation to provide distributed sensing indicative of mechanical disturbances of said optical fibre wherein the optic fibre is mechanically coupled to a material whose dimensions vary dependent on the applied magnetic field; and
interrogating a second length of optical fibre radiation to provide distributed sensing indicative of mechanical disturbances of said second length of optical fibre, wherein the second length of optical fibre is configured to be substantially insensitive to applied magnetic fields.

25. A method as claimed in claim 24 comprising using the signals from interrogating the second length of optical fibre to compensate for any non-magnetically induced disturbances affecting the first length of optical fibre.

26. A method as claimed in claim 24 comprising providing a biasing magnetic field to the first length optical fibre.

27. A method as claimed in claim 26 wherein providing said biasing magnetic field comprises generating an electric current in electrical conductor arranged along the first length of optical fibre.

28. A method as claimed in claim 27 wherein said current is generated so as to generate the biasing magnetic field at a predetermined frequency.

29. A method as claimed in claim 28 further comprising dithering said biasing magnetic field.

* * * * *